(12) United States Patent  (10) Patent No.: US 7,613,004 B2
Sasaki  (45) Date of Patent: Nov. 3, 2009

(54) HEAT SINK WITH HEAT DISSIPATING FINS AND METHOD OF MANUFACTURING HEAT SINK

(75) Inventor: Chiyoshi Sasaki, Tokyo (JP)

(73) Assignee: The Furukawa Electric Co., Ltd. (JP)

( * ) Notice: Subject to any disclaimer, the term of this patent is extended or adjusted under 35 U.S.C. 154(b) by 102 days.

(21) Appl. No.: 10/803,582

(22) Filed: Mar. 17, 2004

(65) Prior Publication Data

US 2004/0190260 A1 Sep. 30, 2004

(30) Foreign Application Priority Data

Mar. 31, 2003 (JP) ............................. 2003-093468

(51) Int. Cl.
 *H05K 7/20* (2006.01)
 *H01L 23/34* (2006.01)
 *H01B 7/42* (2006.01)
 *B21D 53/02* (2006.01)

(52) U.S. Cl. ...................... 361/710; 361/704; 361/709; 361/697; 361/700; 257/E23.103; 257/721; 257/722; 174/16.1; 174/16.3; 165/80.3; 165/185; 29/890.03

(58) Field of Classification Search ......... 361/703–704, 361/697, 710, 709; 29/890.03; 165/80.3; 165/185; 257/E23.103, 721, 722; 174/16.1, 174/16.3
See application file for complete search history.

(56) References Cited

U.S. PATENT DOCUMENTS 5,038,858 A * 8/1991 Jordan et al. ................ 165/185
6,357,514 B1 * 3/2002 Sasaki et al. ............... 165/80.3
2003/0183371 A1 * 10/2003 Zeighami et al. .......... 165/80.5

* cited by examiner

*Primary Examiner*—Jayprakash N Gandhi
*Assistant Examiner*—Zachary M Pape
(74) *Attorney, Agent, or Firm*—Cantor Colburn LLP

(57) ABSTRACT

A heat sink comprising: a heat dissipating portion comprising a plurality of metal fins each having a heat receiving portion and a heat dissipating portion having elasticity; a fin fixing member to transfix said plurality of metal fins; a metal plate having a plurality of slits into which said respective heat dissipating portions are inserted and press-connected thereto with use of said elasticity; and a joining portion to join said metal plate and said heat dissipating portions which are inserted into said respective slits and fixed thereto.

7 Claims, 6 Drawing Sheets

FIG. 12

HEAT SINK WITH HEAT DISSIPATING FINS AND METHOD OF MANUFACTURING HEAT SINK

BACKGROUND OF THE INVENTION

1. Field of the invention

The present invention relates to a heat sink and a method of manufacturing the heat sink. The heat sink with the heat dissipating fins of the invention is applicable to a heat sink for heat dissipating and cooling of the heat generating electronic components such as electronic devices as represented by personal computers, game devices, for example, and in addition to the heat dissipation and cooling in all the field necessary to be heat-dissipated.

2. Related Art

Semiconductor chips and the like used in various electronics devices such as personal computer, game device, audio device or the like are downsized and densely integrated so that the processing speed is remarkably improved to result in higher heat-generating density.

As a means for dissipating the heat generated by electronic devices such as personal computer, game device, audio device or the like including semiconductor chips with high heat-generating density, a fan is fixed on the electronic device to lower the temperature of the air within the box of the device, or a cooling member is attached to the heat generating device to cool the device, for example.

The cooling member comprises a heat transfer metal member, for example, a plate member, a block or the like. The heat generated by the heat generating device is received by the metal block and dissipated through heat dissipating fins attached to the metal block. Such a heat sink with fins is widely used.

In addition, the electronic device is required not only to have cooling ability by heat dissipation, but also to have a remedy means to control electric noise, thus the interior of the device is covered by a metal shield plate member. Japanese patent provisional publication No. 2001-57405 discloses a heat sink with a metal shield plate member and heat dissipating fins combined.

Conventionally, the heat sink for heat dissipation and the shield plate member are separately made, i.e., the heat sink and the shield plate member are designed to have constructions to be combined together. For the heat sink for heat dissipation, various mountain-shaped corrugated fins are widely used. Limited enveloping volume of the mountain-shaped corrugated fin enables to increase a heat dissipating surface of the fin, and realize a light weight fin. In the heat dissipation with the use of the mountain-shaped corrugated fin, the heat generated by the heat source is received by a heat transfer plate member, block or the like, and then the heat is dissipated through the mountain-shaped corrugated fin attached to the heat transfer plate member or the block.

However, since the space between the circuit board and the inner surface of the box is narrow in a thin-type electronic device, the space between the metal shield plate member and the circuit board becomes narrow, accordingly.

By means of the heat dissipating method in which the heat generated by the heat generating device is received by the heat transfer block or the like, and dissipated to a specific place or air through the heat dissipating fin, there is a problem that the metal block or the like may not be provided within the thin-type electronic device. Furthermore, when the space between the metal shield plate member and the circuit board is narrow and a consuming power of the heat generating device is large, the corresponding portion of the metal shield plate member to the heat dissipating fins of the heat sink is cut off, thus lowering the shield effect.

Furthermore, since the metal plate, block or the like is positioned in the heat path between the heat source and the heat dissipating fin and the contact heat resistance is produced between the metal plate, block or the like, the heat dissipating efficiency of the whole heat sink comes to deteriorate.

SUMMARY OF THE INVENTION

An object of the invention is to provide a heat sink with heat dissipating fins and the method therefore in which the manufacturing cost is low, the heat dissipating efficiency is excellent without lowering the shield effect, and it may be used in the thin-type electronic device.

The inventors have intensively studied to overcome the above-mentioned problem. As a result, it has been found that when the same number of the slits as the number of the heat dissipating fins are formed in the metal shield plate member and the heat dissipating fins are inserted into the respective slits of the metal shield plate member, the shield effect can be prevented from being lowered. Furthermore, it has been found that when the L shaped heat dissipating fin comprising a heat receiving portion and a heat dissipating portion is employed such that the heat receiving portion directly contacts with the heat generating device, the metal block is not necessary anymore, thus enabling to use in the thin type electronic device. Furthermore, it has been found that when the part of the heat dissipating fin is inserted into the part of the slit using the elasticity of the flat plate type heat dissipating fin and then the remaining part of the heat dissipating fin is pushed down into the slit along the shape of the slit, the heat dissipating fin is easily inserted and fixed into the slit.

One embodiment of a method of manufacturing a heat sink of the invention comprises the steps of:

preparing a metal plate having a plurality of slits and a plurality of metal fins each having a heat receiving portion and a heat dissipating portion;

inserting respective parts of said heat dissipating portions of said metal fins into respective slits of said metal plate;

pushing respective remaining parts of said heat dissipating portions down to a specific depth along configurations of said slits having a prescribed shape in such manner that said fins are press-connected to said metal plate.

One of other embodiment of a method of manufacturing a heat sink comprises the steps of:

preparing a metal plate having a plurality of slits each having a prescribed shape including a curved portion and a plurality of metal fins each having a heat receiving portion and a heat dissipating portion;

inserting respective one end portions in a longitudinal direction of said heat dissipating portions into respective said curved portions of said slits;

pushing respective remaining parts of said heat dissipating portions down to a specific depth along configurations of said slits using elasticity of said heat dissipating portions in such manner that said fins are press-connected to said metal plate.

In one of other embodiment of the method, the method further comprises the step of plastic-deforming said metal plate in both sides of the respective parts of the heat dissipating portions which are inserted into said slits and press-connected to said metal plate to fix said fins to said metal plate.

In one of other embodiment of the method, each of said slits has a substantially same width corresponding to a thickness of said heat dissipating portion across the metal plate, and each of said slits spreads toward respective one end portions in a longitudinal direction with remaining portions paralleled each other.

In one of other embodiment of the method, each of said slits has a substantially same width corresponding to a thickness of said heat dissipating portion across the metal plate, and each of said slits spreads toward respective both end portions in a longitudinal direction with center portions paralleled each other.

In one of other embodiment of the method, said heat dissipating portions are placed in parallel and pushed down into said slits in such manner that respective heat receiving portions of said metal fins form a single heat receiving face as a whole.

In one of other embodiment of the method, said heat sink includes a fin fixing member to transfix said heat dissipating portions placed in parallel, and said heat dissipating portions fixed by said fin fixing member are pushed into said slits until an upper end portion of said fin fixing member contacts with a lower face of said metal plate.

One embodiment of a heat sink of the invention comprises:
a heat dissipating portion comprising a plurality of metal fins each having a heat receiving portion and a heat dissipating portion having elasticity;
a fin fixing member to transfix said plurality of metal fins;
a metal plate having a plurality of slits into which said respective heat dissipating portions are inserted and press-connected thereto with use of said elasticity; and
a joining portion to join said metal plate and said heat dissipating portions which are inserted into said respective slits and fixed thereto.

One embodiment of a heat sink of the invention comprises:
a heat dissipating portion comprising a plurality of metal fins each having a heat receiving portion and a heat dissipating portion having elasticity;
a fin fixing member to transfix said plurality of metal fins;
a metal shield plate having a plurality of slits including curved portion into which said respective heat dissipating portions are inserted and press-connected thereto with use of said elasticity; and
a joining portion to join said metal shield plate and said heat dissipating portions which are inserted into said respective slits and fixed thereto.

In one of other embodiment of the heat sink, each of said slits has a substantially same width corresponding to a thickness of said heat dissipating portion across the metal plate, and each of said slits spreads toward respective one end portions in a longitudinal direction with remaining portions paralleled each other.

In one of other embodiment of the heat sink, each of said slits has a substantially same width corresponding to a thickness of said heat dissipating portion across the metal plate, and each of said slits spreads toward respective both end portions in a longitudinal direction with center portions paralleled each other.

In one of other embodiment of the heat sink, each of said slits has a substantially same width corresponding to a thickness of said heat dissipating portion across the metal plate, and each of said slits is parallel each other in a longitudinal direction.

In one of other embodiment of the heat sink, each of said heat receiving portion and said heat dissipating portion of said fin comprises a square flat plate portion.

In one of other embodiment of the heat sink, said plurality of fins are placed in parallel in such manner that respective heat receiving portions of said fins form a single heat receiving face as a whole.

In one of other embodiment of the heat sink, said fin fixing member comprises a heat pipe.

DETAILED DESCRIPTION

Referring now to the drawings, the embodiments of the heat sink with fins of the invention and the method of manufacturing same will be explained in detail.

The first embodiment of the method of manufacturing a heat sink of the invention comprises the steps of:
preparing a metal plate having a plurality of slits and a plurality of metal fins each having a heat receiving portion and a heat dissipating portion;
inserting respective parts of said heat dissipating portions of said metal fins into respective slits of said metal plate;
pushing respective remaining parts of said heat dissipating portions down to a specific depth along said slits having a prescribed shape in such manner that said fins are press-connected to said metal plate.

Figure 5:
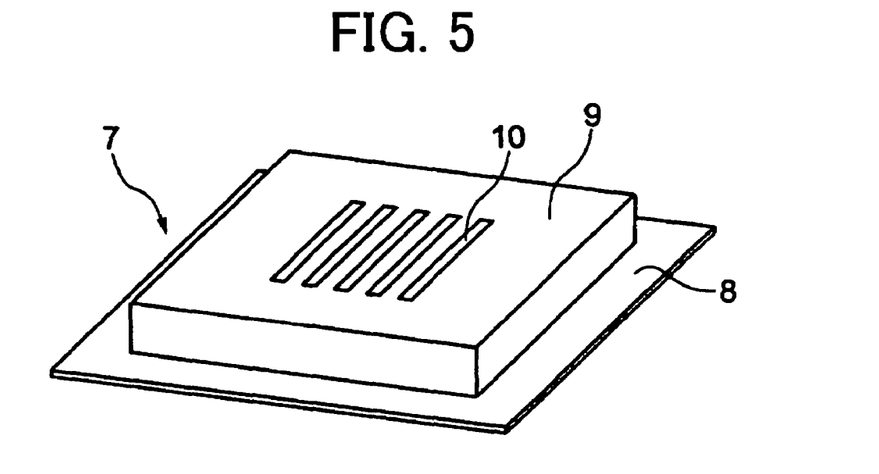
FIG. 5 is a schematic view showing a metal shield plate member having a plurality of slits of a prescribed shape.

FIG. 5 is a schematic view showing a metal shield plate member having a plurality of slits of a prescribed shape. As shown in FIG. 5, the metal plate member 7 comprises a metal shield plate member for an electromagnetic shield, for example, which is fabricated by a thin plate and includes an upper portion 9 and a peripheral portion 8 to be fixed in contact to a circuit board. A plurality of slits 10 having a prescribed shape are formed in the upper portion 9. The slit may be a shape of the straight line or include curved portion. The number of the slits are the same as the number of the corresponding heat dissipating fins.

Figure 8:
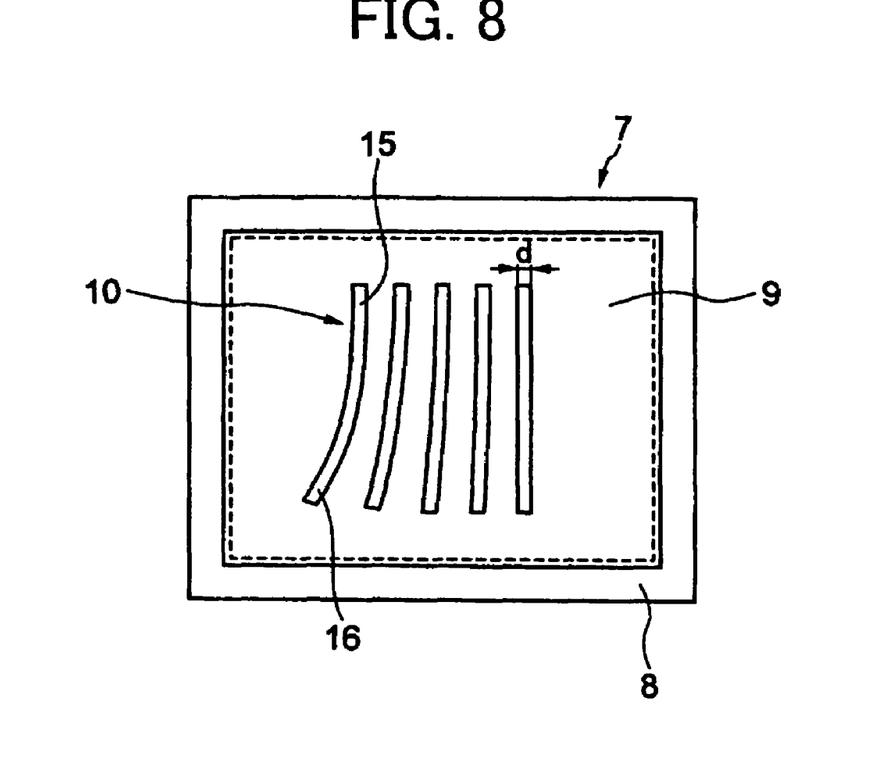
FIG. 8 is a schematic view showing a metal shield plate member in which a plurality of slits with curved portion are formed.

FIG. 8 is a schematic view showing a metal shield plate member in which a plurality of slits with curved portion are formed. As shown in FIG. 8, the slit 10 has a width (d) corresponding to the thickness of (not shown) the heat dissipating portion of the heat dissipating fin, which is substantially the same width across the slit. The width of the slit may be the size in which the heat dissipating fin can move within the slit. As described later, the heat dissipating fin and the metal shield plate member are fixed (i.e., press-connected), thus the metal shield plate member can be effectively used as a part of the heat dissipating member. The slit slightly spreads outward toward respective one end portion 16 in a longitudinal direction, and the remaining portions 15 of the slits are in parallel each other.

Furthermore, the slit has a corresponding width to the thickness of the heat dissipating portion of the above-mentioned heat dissipating fin, and may be substantially the same width across the slit. Each of the slits may spread outward toward respective both end portions in the longitudinal direction with center portions thereof paralleled each other (not shown).

The configuration of the slit is not limited to the above-mentioned shapes. More specifically, the slit may be a slow wave shape as far as the heat dissipating fin can be inserted into the slit with the use of the elasticity thereof along the configuration of the slit.

Figure 1:
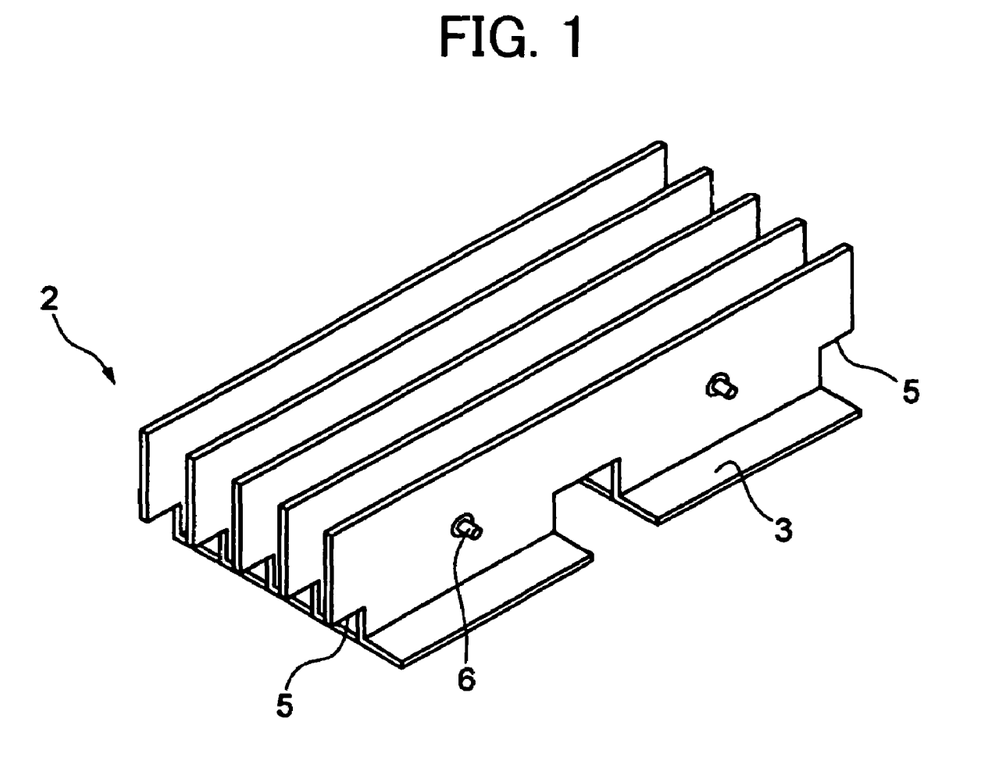
FIG. 1 is a schematic perspective view showing the heat dissipating fin portion of the invention.
Figure 2:
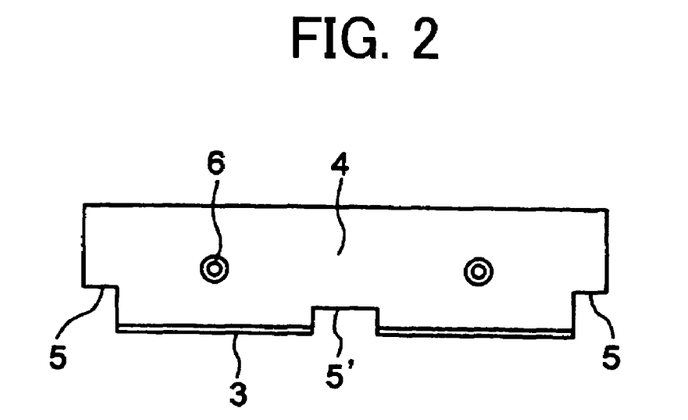
FIG. 2 is a front view of the heat dissipating fin portion of the invention.
Figure 3:
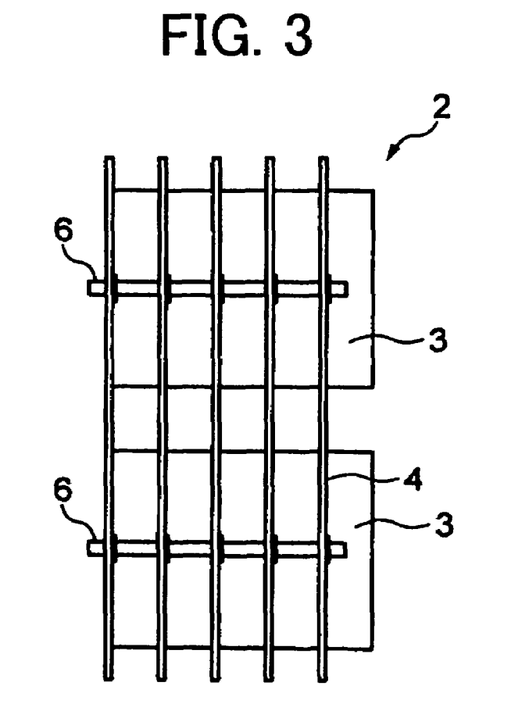
FIG. 3 is a plan view of the heat dissipating fin portion of the invention.
Figure 4:
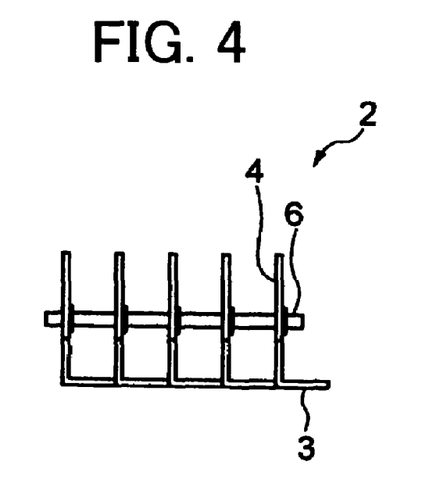
FIG. 4 is a side view of the heat dissipating fin portion of the invention.

FIG. 1 is a schematic perspective view showing the heat dissipating fin portion of the invention. FIG. 2 is a front view of the heat dissipating fin portion of the invention. FIG. 3 is a plan view of the heat dissipating fin portion of the invention. FIG. 4 is a side view of the heat dissipating fin portion of the invention. As shown in FIG. 1, the heat dissipating fin portion 2 comprises a plurality of metal fins including a heat receiving portion 3 to thermally contact in direct with a heat generating member, for example, a CPU, and a heat dissipating portion 4 formed to be extended in perpendicular to the heat receiving portion. The heat dissipating fin portion 2 includes a fin fixing member 6 to transfix the metal fins. Although two fin fixing members are shown in FIG. 1, the fin fixing member may be one or two in correspondence to the size of the heat dissipating fins.

As shown in FIGS. 1 and 2, the both end portions 5 of the heat dissipating portion 4 of the metal fin have respective free end portion which does not directly contact with the heat receiving portion. Thus, the both end portions allow the easy elastic deformation such as bending with the use of the elasticity of the metal fin. More specifically, as described later, when the heat dissipating portion of the metal fin is inserted into the slit, the both end portions 5 of the heat dissipating portion can be used as guiding portions to guide the heat dissipating portion along the configuration of the slit. Furthermore, when the heat dissipating fin portion is to be fixed, a notch portion 5' may be provided between two heat receiving portions, for example, as shown in FIG. 2 so as to facilitate the mechanical joint such as crimping.

As shown in FIGS. 3 and 4, there are provided in parallel a plurality of metal fins comprising the heat receiving portion 3 and the heat dissipating 4, and the fins are transfixed by the fin fixing member 6. Respective heat receiving portions 3 are arranged in parallel so as to form a unit of heat receiving face having a prescribed size. The heat receiving face is thermally connected to the heat generating member through a heat transfer grease or the like. The fin fixing member 6 penetrates respective fins which are fabricated by, for example, burring (which forms a perpendicularly protruding joining portion of the fin and the fin fixing member to the heat dissipating portion as shown in FIGS. 3 and 4) to transfix the fins arranged in parallel. As is evident from FIG. 3, the both end portions of the heat dissipating portion have the free ends, respectively.

Figure 10:
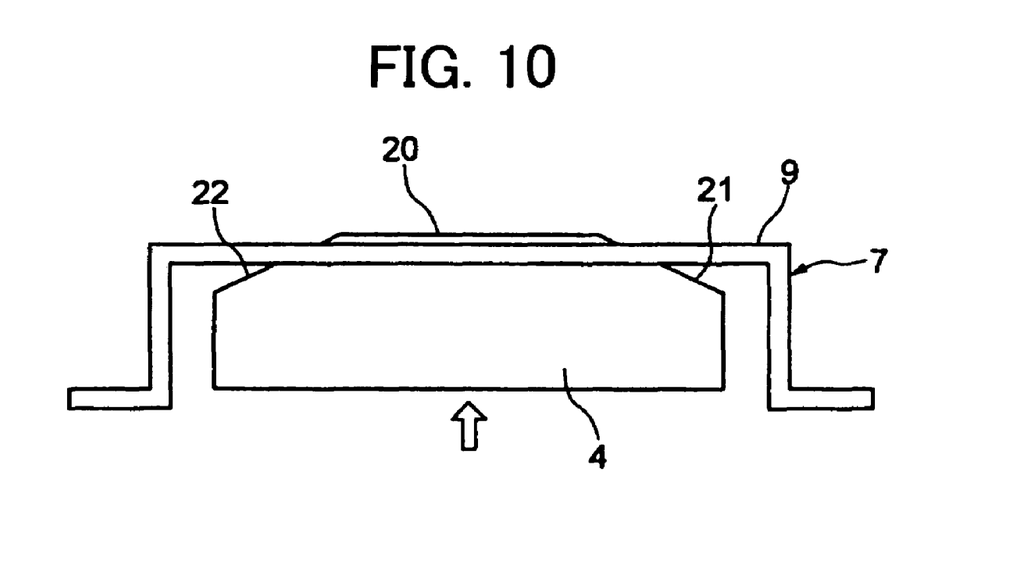
FIG. 10 is a schematic view showing a principle to manufacture a heat sink of the invention.
Figure 11:
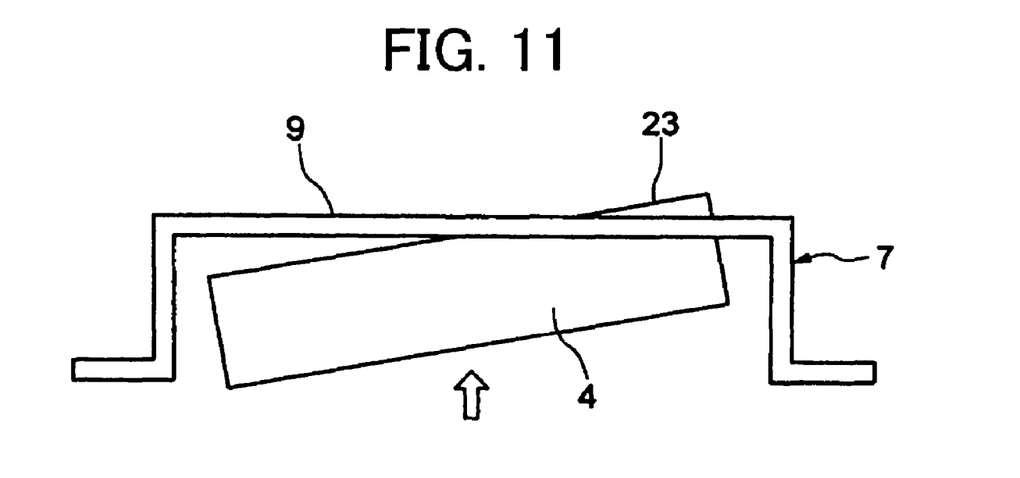
FIG. 11 is a schematic view showing a principle to manufacture a heat sink of the invention.

FIGS. 10 and 11 are schematic views explaining the principle to manufacture a heat sink of the invention. More specifically, the respective parts of the heat dissipating portions of the heat dissipating fin portion 2 as shown in FIGS. 1 to 4 are inserted from the lower side of the metal shield plate member into the plurality of respective slits having the shapes as shown in FIG. 8 formed in the upper portion 9 of the metal shield plate member 7, and then the respective remaining portions of the heat dissipating portions are pushed to a prescribed depth, using the elasticity of the heat dissipating portion, thus fixing (i.e., press-connecting) the fins to the metal shield plate member. More specifically, as shown in FIG. 10, the heat dissipating portion having the slanted portions 21, 22 on the upper side thereof is inserted from the lower side into the slit formed in the metal shield plate member 7 and pushed upward. The slanted portions 21, 22 are elastically deformed (i.e., bent) along the prescribed configuration of the slit including curved portion, thus the heat dissipating portions are inserted into the slits to the prescribed depth. That is, the above-mentioned slated portion functions as a guiding portion into the slit having the prescribed configuration.

The heat dissipating portion of the heat dissipating fin inserted into the slit moves slightly by the elasticity thereof in correspondence to the variations of the configuration of the slit, thus press-connected between the prescribed portions of the inner walls of the slit. Thus, the heat dissipating portions are inserted into the slits and fixed (press-connected) in correspondence to the configuration of the slits, i.e., spreading outward toward respective one end portions in a longitudinal direction with remaining portions paralleled each other, or spreading outward toward respective both end portions in a longitudinal direction with center portions paralleled each other. When the both end portions of the heat dissipating portion have the free end portions, respectively, the elastic deformation corresponding to the configuration is facilitated. The configuration of the slit is not limited to the above-mentioned configuration. For example, wave shaped configuration is included.

Furthermore, as shown in FIG. 11, the respective parts of the heat dissipating portions 4 are inserted from the lower side of the metal shield plate member into the plurality of corresponding slits having the shapes formed in the metal shield plate member 7, as is declined, and then the remaining portions of the heat dissipating portions are pushed to a prescribed depth, using the elasticity of the heat dissipating portion, thus fixing (i.e., press-connecting) the fins to the metal shield plate member. More specifically, as shown in FIG. 11, the heat dissipating portion having the substantially parallel upper side and lower side (i.e., in this embodiment, the slanted portion is not included in the end portion as the guiding portion when being inserted) is inserted, while the heat dissipating portion per se is declined, from the lower side into the slit formed in the metal shield plate member 7 and pushed upward. The declined upper portion of the heat dissipating portion is elastically deformed (i.e., bent) along the configuration of the slit including curved portion, thus the heat dissipating portion is fully inserted into the slit.

In this embodiment, the heat dissipating portion of the heat dissipating fin inserted into the slit moves slightly by the elasticity thereof in correspondence to the variations of the configuration of the slit, thus press-connected between the prescribed portions of the inner walls of the slit. Thus, the heat dissipating portion are inserted into the corresponding slits and fixed (press-connected) in correspondence to the configuration of the slits, i.e., spreading outward toward respective one end portions in a longitudinal direction with remaining portions paralleled each other, or spreading outward toward respective both end portions in a longitudinal direction with center portions paralleled each other. When the both end portions of the heat dissipating portion have the free end portions, respectively, the elastic deformation corresponding to the configuration is facilitated.

Figure 9:
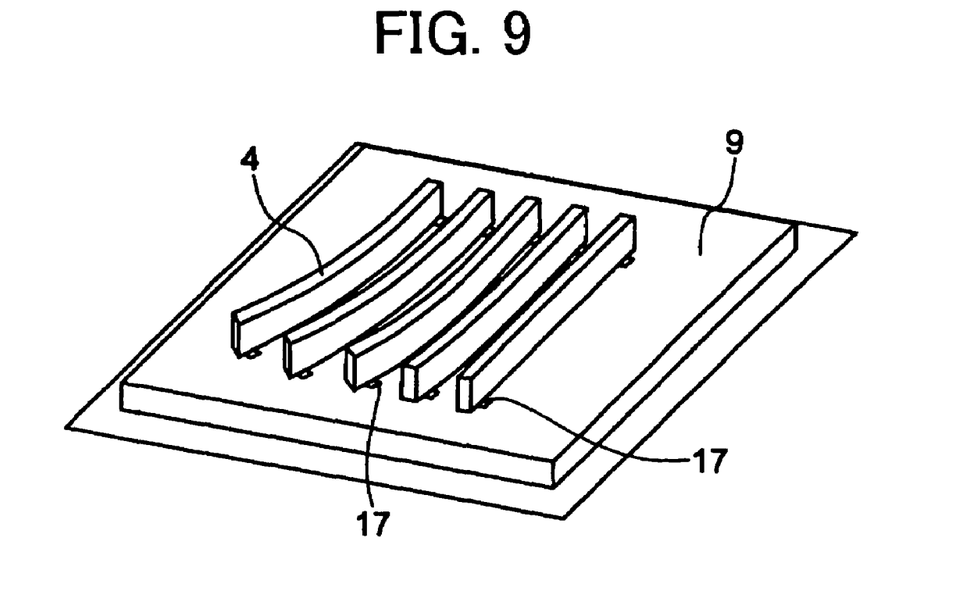
FIG. 9 is a schematic view showing a manner to fix part of the heat dissipating portion inserted and fixed in the slit of the metal shield plate member.

In the manufacturing method of the heat sink of the invention, the method may further comprises the step of plastic-deforming the metal plate in both sides of the respective parts of the heat dissipating portions which are inserted into the slits and press-connected to the metal plate to fix the fins to the metal plate. Furthermore, the heat dissipating portions inserted and fixed into the slits and the metal shield plate member may be joined by soldering. FIG. 9 is a schematic view showing a manner to fix the heat dissipating portions inserted and fixed in the slits of the metal shield plate member. As shown in FIG. 9, since the heat dissipating portions are inserted from the lower side into the corresponding slits formed in the upper portion 9 of the metal shield plate member, as described above, the heat dissipating portion per se is elastically deformed and received in the slit, thus being fixed (i.e., press-connected) from both sides. The heat dissipating portions are pushed from the sides by the inner walls in the bending portion of the slit to be fixed to the metal shield plate member. In addition, the both sides of the respective heat dissipating portions 4 of the heat dissipating fins are mechanically plastic-deformed by crimping to be further fixed. The crimped portions to fix the heat dissipating portions to the metal shield plate member are shown by the reference number 17.

Figure 7:
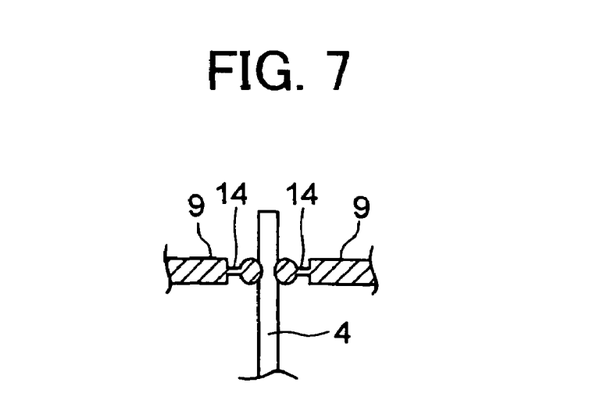
FIG. 7 is a schematic view showing in detail a manner to mechanically plastic-deform the heat dissipating portion inserted and fixed in the slit.

FIG. 7 is a schematic view showing in detail a manner to mechanically plastic-deform the heat dissipating portion inserted and fixed in the slit. In the manufacturing method of the heat sink of the invention, as described above, the heat dissipating portion of the heat dissipating fin inserted and fixed in the slit is mechanically plastic-deformed to be further fixed. More specifically, the metal plate member is press-deformed and crimped in such manner that the heat dissipating portion is firmly pressed and joined in the slit of the metal plate. In other words, the heat dissipating portions 4 are inserted in the slits provided in parallel in the upper portion 9 of the metal shield plate member, and the concave portions are formed by press-deformation (i.e., plastic deformation) on the both sides of the respective slits of the metal shield plate member, i.e., the vicinity of the both sides of the heat dissipating portion 5 of the heat dissipating fin, where the concave portion 14 has preferably a cross section comprising a flat bottom face and slanted side faces, and is tapered so as to form a reverse trapezoid. Thus, the plastic deformation joins the heat dissipating portion 4 in the slit by cramping.

As shown in FIG. 7, in the manufacturing method of the heat sink of the invention, since the concave portions 14 provided in the vicinity of the both sides of the heat dissipating portion inserted in the slit are formed in such manner that the cross section of the concave portion is a tapered reverse trapezoid, an amount of the plastic deformation is large and the slanted faces are pressed to compress the heat dissipating portion.

In order to plastically deform the metal plate member, the heat dissipating portion is inserted into the slit of the metal shield plate member and then the vicinity of the both sides of the heat dissipating portion in the metal shield plate member are pressed to plastically deform by a prescribed pressing jig. The pressing jig has the end portion of which cross section is tapered to form a trapezoid as described above, for example. The end portion of the pressing jig presses the metal plate member in the vicinity of the both sides of the heat dissipating portion inserted in the slit, thus being plastic-deformed.

Figure 12:
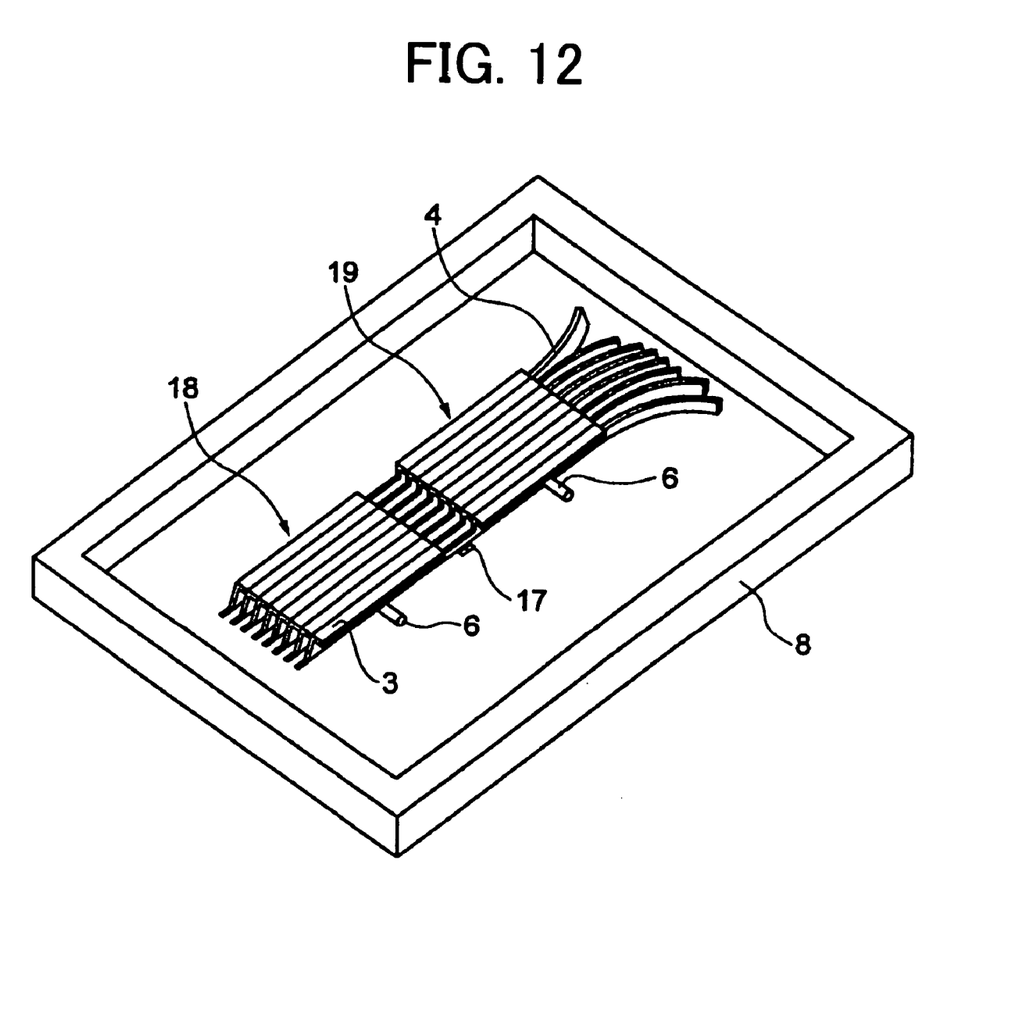
FIG. 12 is a schematic view from the back side of the heat sink showing a manner that the heat dissipating portions are inserted and fixed in the slits of the metal shield plate member.

FIG. 12 is a schematic view from the back side of the heat sink showing a manner that the heat dissipating portions are inserted and fixed in the corresponding slits of the metal shield plate member. More specifically, the peripheral portion 8 of the metal shield plate member as described with reference to FIG. 5 appears in the upper side, and the heat receiving face of the heat dissipating portion appears on the back side of the upper portion 9. As shown in FIG. 12, a plurality of L-shaped metal fins including the heat receiving portion 3 and the heat dissipating portion 4 are arranged in parallel, and the metal fins are transfixed by the fin fixing member 6. Thus fixed heat dissipating portions are guided and inserted along the configuration of the plurality of slits including curved portions to be fixed (press-connected) to the metal plate member. The heat dissipating portions are pushed down until the upper face of the fin fixing member transfixing the heat dissipating portions contact with the lower face of the metal shield plate member.

The plurality of the heat receiving portions 3 of the metal fins are arranged in parallel to form two flat heat receiving faces 18, 19 having prescribed sizes. The portion corresponding to the notch portion 5', as described with reference to FIGS. 1 and 2, is positioned between two heat receiving faces 18, 19. Accordingly, as shown in FIG. 12, the notch portion 5' can be used as a portion to which the crimped metal flows, thus the both sides of the heat dissipating fins can be easily crimped. The fin fixing member 6 penetrating and transfixing the heat dissipating portions of the fins contacts with the back face of the metal plate member, thus having a positioning function preventing the heat dissipating portions from being inserted exceeding a prescribed depth.

Furthermore, the vicinity in the metal plate of the both sides of the heat dissipating portions 4 inserted and fixed in the slits are pressed by the prescribed pressing jig around the notch portion and the free end portions to be plastic-deformed, thus the heat dissipating portions are crimped to the metal shield plate member, as depicted by the reference number 17. As shown in FIG. 12, one end portions of the heat dissipating portions are bent outward by prescribed R (curvature) and fixed. When a fan is arranged in the vicinity of one end portion of the heat dissipating fin portion 2, an air flowing efficiency (i.e., collecting air) of the heat dissipating fins bent outward with the R is improved to increase heat dissipating.

The heat sink with heat dissipating fins are described hereunder. One embodiment of the heat sink with heat dissipating fins of the invention is a heat sink comprising: a heat dissipating portion comprising a plurality of metal fins each having a heat receiving portion and a heat dissipating portion having elasticity; a fin fixing member to transfix said plurality of metal fins; a metal plate having a plurality of slits into which said respective heat dissipating portions are inserted and press-connected thereto with use of said elasticity; and a joining portion to join said metal plate and said heat dissipating portions which are inserted into said respective slits and fixed thereto.

Other embodiment of the heat sink with heat dissipating fins is a heat sink comprising: a heat dissipating portion comprising a plurality of metal fins each having a heat receiving portion and a heat dissipating portion having elasticity; a fin fixing member to transfix said plurality of metal fins; a metal shield plate having a plurality of slits including curved portion into which said respective heat dissipating portions are inserted and press-connected thereto with use of said elasticity; and a joining portion to join said metal shield plate and said heat dissipating portions which are inserted into said respective slits and fixed thereto.

When the plurality of heat dissipating fins are arranged in parallel, the bottom portions (i.e., heat receiving portion) of the respective heat dissipating fins form a integrated heat receiving face to which the heat generating component mounted on the printed board is thermally connected. More specifically, the heat receiving face formed by the respective bottom portions of the heat dissipating fins is directly connected to the heat generating electronic component. In addition, the heat receiving face formed by the bottom portions is connected through a heat transfer intermedium such as a heat transfer rubber or the like.

As shown in FIGS. 1 to 4, each of the heat dissipating fin 2 comprises a bottom portion as the heat receiving portion and a vertical portion as the heat dissipating portion. An aperture (for example, an aperture formed by burring) is formed in the vertical portion into which the fin fixing member is inserted. As described above, when the plurality of heat dissipating fins are arranged in parallel, the bottom portions thus arranged in parallel form a flat integrated heat receiving face. The both end portions of the heat dissipating portion function as a guide portion to guide the heat dissipating fin into the slit, as described with reference to the method of manufacturing the heat sink. The heat dissipating portion may form one heat receiving face or two heat receiving faces. In addition, when the heights of the heat generating components are different, the heights of the heat receiving faces may be different in correspondence to the respective heat generating components having different heights.

Each of the slits formed in the upper portion of the metal plate member has a substantially same width (d) corresponding to the thickness of the heat dissipating portion across the slit in a longitudinal direction. The slit slightly spreads outward toward respective one end portion in a longitudinal direction, and the remaining portions of the slits are in parallel each other. Each of the slits may spreads outward toward respective both end portions in the longitudinal direction with center portions thereof paralleled each other. In addition, each of the slits has a substantially same width (d) corresponding to the thickness of the heat dissipating portion across the slit in a longitudinal direction, and the slits are in parallel each other as a whole.

Figure 6:
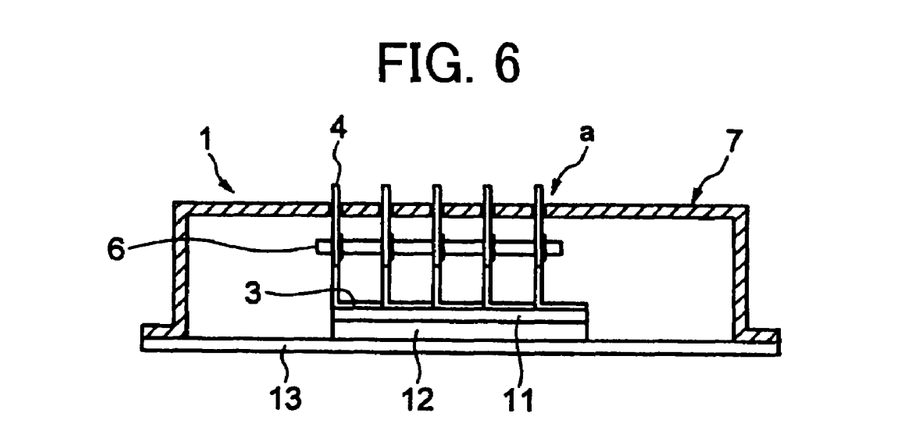
FIG. 6 is a sectional view showing a heat sink with heat dissipating fins of the invention.

FIG. 6 is a sectional view showing a heat sink with heat dissipating fins of the invention. As shown in FIG. 6, the heat dissipating fin portion comprises a plurality of L-shaped heat dissipating fins arranged in parallel and transfixed by the fin fixing member 6, in which each of the L-shaped heat dissipating fin includes the heat receiving portion 3 and the heat dissipating portion 4. The heat generating device is thermally connected through the heat transfer rubber to the heat receiving portion of thus formed heat dissipating fin portion. The heat receiving portion and the heat dissipating portion comprise a square flat plate portion respectively which forms the L-shaped plate member. A flat heat receiving face corresponding to the size of the heat generating device is formed by the plurality of heat receiving portions 3 arranged in parallel. The slits each including the curved portion and having a prescribed configuration are formed in the upper portion of the metal shield plate member 7. The number of the slits are the same as that of the heat dissipating fins. The heat dissipating portion comprising a flat plate member is inserted into the above-mentioned slit along the configuration of the slit with the use of the elasticity thereof down to a prescribed depth, thus fixed. The metal shield plate member and the heat dissipating portion are further fixed by crimping, as described with reference to FIG. 7. The peripheral portion of the metal shield plate member is fixed on the circuit board.

As described above, in the heat sink with fins of the invention, since the same number of slits as that of the heat dissipating portion of the heat dissipating fin portion, and the heat dissipating portion is inserted into the slit and press-connected thereto, the excellent shield effect can be obtained. Furthermore, since the heat receiving portion of the heat dissipating fin is directly connected to the heat generating device without using the metal block or the like therebetween, the heat sink with such excellent heat dissipating efficiency as to be applied in thin type electronics device can be obtained even when the gap between the metal shield plate member and the circuit board is narrow. In addition, according to the method of manufacturing the heat sink of the invention, the fabricating cost can be lowered since the flat plate-type heat dissipating fin is simply inserted and pressed into the slit having curved portion in such manner that the heat dissipating portion is inserted in the slit along the configuration thereof and press-connected thereto.

Furthermore, the above-mentioned fin fixing member may comprise a heat pipe. The heat pipe includes a hermetically sealed cavity portion. The heat is transferred by the phase transition and movement of the working fluid received in the cavity portion. The part of the heat is directly transferred through the material forming the container of the heat pipe. The most of the heat is transferred by the phase transition and movement of the working fluid.

The heat transferred from the heat generating component to the heat dissipating fin causes the working fluid to evaporate in the heat absorbing side of the heat pipe, and then the evaporated working fluid swiftly moves toward the heat dissipating side of the heat pipe. That is, the heat transferred to the heat dissipating fin is conducted through the material forming the container of the heat pipe to the working fluid. The evaporated working fluid is cooled in the heat dissipating side of the heat pipe, and returns to the liquid phase. The liquid phase working fluid returns to the heat absorbing side of the heat pipe (i.e., circulation). Thus, the heat is transferred by the phase transition and movement of the working fluid.

In general, water, aqueous solution, alcohol, other organic solvent or the like may be used for the working fluid in the heat pipe. Mercury may be used for a specific purpose. Since the phase transition of the working fluid is used within the heat pipe, the heat pipe is manufactured in such manner that the materials other than the working fluid such as gases are prevented from being mixed into the hermetically sealed container. As the mixture into the working fluid in the container, there are air (open air) which is entrapped during the fabrication and the carbon dioxide gas melt in the working fluid. The configuration of the heat pipe includes a round type, and a flat type. Furthermore, the heat transferred by the heat pipe may be forcedly cooled by means of the fan.

Metals having excellent heat transfer such as cupper or aluminum may be used as the material for the container of the heat pipe. Aluminum having excellent workability is preferably used so that the flat container may be fabricated. The same material as that of the flat container may be used for a wick. Water, substituted fleon or florinate may be used for the working fluid, considering compatibility with the material of the container of the heat pipe.

Other end of the heat pipe may be further extended and fixed on another heat generating component mounted on the printed board. More specifically, the metal heat receiving block is provided through the heat transfer sheet on the another heat generating electronic component, and the other end of the heat pipe is inserted and firmly fixed into the hole portion formed in the heat receiving block to be thermally connected thereto. The arrangement of the heat pipe in the above manner enables to transfer the heat of the another heat generating component to the heat dissipating fin, and thus heat-dissipating the transferred heat through the heat dissipating fin.

The heat dissipating fin portion is fabricated by placing with the fin pitch of 5 mm in parallel five L-shaped aluminum fins each having height of 30 mm, length of 80 mm, and thickness of 0.5 mm. Two heat receiving faces each having length of 25 mm are formed with 5 mm interval by the bottom portions of the five L-shaped aluminum fins. The respective heat dissipating fins of the heat dissipating fin portion thus formed are inserted into and fixed to the slits formed in the upper portion of the shield plate for an electromagnetic shield, in which the slits slightly spread outward toward respective one end portion in a longitudinal direction while the remaining portions are in parallel each other.

The heat dissipating fin and the metal shield plate member may be made of aluminum, steel, cupper or the like. The heat dissipating fin and the metal shield plate member may be made of the same material.

The portion in which the above-mentioned fin and the fin fixing member are coupled and fixed may be formed, for example, by crimping, joining, or soldering fins made of elastic material on the metal base plate having a plate-shape.

According to the invention, since the portions to which the crimped metal flows are formed in the heat dissipating fins, the heat dissipating portion of the heat sink can be easily crimped on the metal shield plate member. Since the heat dissipating fin portions of the heat sink are fixed by crimping on the metal shield plate member, there is no electric potential difference between the metal shield plate member and the heat sink, thus lowering the electric noises. Furthermore, since the metal shield plate member is thermally connected to the heat dissipating portion and applied as the heat dissipating material member, the heat dissipating efficiency is improved. In addition, since the slits slightly spread outside toward respective one end portion in a longitudinal direction, the heat dissipating fin portions inserted into the slits have the function to collect air by the curved portion thereof, thus improving the heat dissipating efficiency.

As described above, according to the present invention, there can be provided the heat sink with fins having excellent heat dissipating efficiency without lowering shield effect, which can be fabricated at lower cost and can be applied to the thin type electronic devices, as well as the method of manufacturing same.

What is claimed is:

1. A heat sink comprising:
   a plurality of plate-like metal fins comprising a heat receiving portion and a heat dissipating elastic portion, said fins being linear or bent along a specific configuration;
   a fin fixing member to transfix said plurality of metal fins;
   a metal shield plate having a plurality of slits including linear and/or curved portions into which said respective fins are inserted along said slits, and press-connected to said fins by forming a first concave portion on a top side of said metal shield plate, a second concave portion on a bottom side of said metal shield plate, and an enlarged portion at the edge of said metal shield plate, wherein said first concave portion is aligned with said second concave portion at a given position on the metal shield plate; and
   a deformed portion of said metal shield plate being fixed with said heat dissipating portions which are inserted into said respective slits and fixed thereto;
   wherein each of said slits has a substantially same width corresponding to a thickness of said fins such that said slits are substantially filled by said fins.

2. The heat sink as claimed in claim 1, wherein each of said slits extends toward respective one end portion of said metal shield plate in a longitudinal direction with remaining portions parallel with each other.

3. The heat sink as claimed in claim 1, wherein each of said slits spreads toward respective both end portions of said metal shield plate in a longitudinal direction with center portions parallel with each other.

4. The heat sink as claimed in claim 1, wherein each of said slits is parallel with each other in a longitudinal direction.

5. The heat sink as claimed in claim 1, wherein each of said heat receiving port ion and said heat dissipating port ion of said fins constitutes a rectangular flat plate portion.

6. The heat sink as claimed in claim 1, wherein said plurality of fins are placed in parallel in such a manner that respective heat receiving port ions of said fins form a single heat receiving face as a whole.

7. The heat sink as claimed in claim 1, wherein said fin fixing member comprises a heat pipe.

* * * * *